(12) United States Patent
Kettinger et al.

(10) Patent No.: US 11,698,431 B2
(45) Date of Patent: Jul. 11, 2023

(54) METHOD FOR ACQUIRING REFERENCE DATA FOR A PHASE CORRECTION IN MAGNETIC RESONANCE TECHNOLOGY

(71) Applicant: Siemens Healthcare GmbH, Erlangen (DE)

(72) Inventors: Adam Kettinger, Bayern (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/487,671

(22) Filed: Sep. 28, 2021

(65) Prior Publication Data
US 2022/0099780 A1    Mar. 31, 2022

(30) Foreign Application Priority Data
Sep. 28, 2020 (DE) .......................... 102020212173.7

(51) Int. Cl.
*G01V 3/00* (2006.01)
*G01R 33/565* (2006.01)
(Continued)

(52) U.S. Cl.
CPC ... *G01R 33/56554* (2013.01); *G01R 33/4835* (2013.01); *G01R 33/5617* (2013.01); *G01R 33/56341* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 5,581,184 A    12/1996    Heid
6,043,651 A     3/2000    Heid
(Continued)

FOREIGN PATENT DOCUMENTS

CN    104067137 A    *    9/2014    .......... G01R 33/385
CN    104574298 B    *    9/2018
(Continued)

OTHER PUBLICATIONS

Breuer, Felix A. et al. "Controlled Aliasing in Parallel Imaging Results in Higher Acceleration (CAIPIRINHA) for Multi-Slice Imaging" Magnetic Resonance in Medicine, vol. 53, No. 3, pp. 684-691, 2005 // DOI: 10.1002/mrm.20401.
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a method and system for acquiring measurement data reference data for a phase correction of the measurement data, a RF excitation pulse is provided to excite spins in the object under examination, one or more RF refocusing pulses are provided to refocus the spins excited by the RF excitation pulse, measurement data is acquired by recording echo signals of refocused spins excited by the RF excitation pulse by switching readout gradients that alternate in their polarity, at least two echo signals are recorded while switching readout gradients with different polarity acquire reference data, chronologically between the providing of the RF excitation pulse and the acquisition of the measurement data, and correction data is determined for phase correction of phase errors contained in the measurement data based on the acquired reference data.

18 Claims, 4 Drawing Sheets

(51) Int. Cl.
*G01R 33/483* (2006.01)
*G01R 33/563* (2006.01)
*G01R 33/561* (2006.01)

(58) Field of Classification Search
USPC .......................................................... 324/307
See application file for complete search history.

(56) References Cited

U.S. PATENT DOCUMENTS

| | | | |
|---|---|---|---|
| 10,162,037 B2 | 12/2018 | Zeller et al. | |
| 2010/0271021 A1* | 10/2010 | Liu .................. | G01R 33/56341 324/309 |
| 2012/0013336 A1* | 1/2012 | Hetzer .................. | G01R 33/485 324/309 |
| 2015/0323634 A1* | 11/2015 | Polimeni ............. | G01R 33/5608 324/309 |
| 2016/0018500 A1* | 1/2016 | Morita ............. | G01R 33/56554 324/309 |
| 2016/0033605 A1* | 2/2016 | Stemmer ............ | G01R 33/4828 324/309 |
| 2017/0089999 A1 | 3/2017 | Zeller et al. | |
| 2019/0011518 A1 | 1/2019 | Feiweier | |
| 2019/0212407 A1* | 7/2019 | Köhler ............. | G01R 33/56518 |

FOREIGN PATENT DOCUMENTS

| | | |
|---|---|---|
| DE | 1445782 C1 | 7/1996 |
| DE | 19715113 A1 | 10/1998 |
| EP | 3425417 A1 | 1/2019 |
| WO | WO-2013051411 A1 * 4/2013 | ........... G01R 33/561 |

OTHER PUBLICATIONS

Schmitt, F. et. al., "Echo-planar imaging: theory, technique and application", Springer Science & Business Media, pp. 162-178, 2012.

Heid, O., "Robust EPI phase correction. In: Proceedings of the Society of Magnetic Resonance in Medicine", Apr. 1997.

Setsompop, Kawin et al. "Blipped-Controlled Aliasing in Parallel Imaging for Simultaneous Multislice Echo Planar maging with Reduced g-Factor Penalty" Magnetic Resonance in Medicine, vol. 67, pp. 1210-1224, 2012 (first published online 2011) // DOI 10.1002/mrm.23097.

German action dated Aug. 16, 2021, Application No. 10 2020 212 173.7.

* cited by examiner

METHOD FOR ACQUIRING REFERENCE DATA FOR A PHASE CORRECTION IN MAGNETIC RESONANCE TECHNOLOGY

CROSS REFERENCE TO RELATED APPLICATIONS

This patent application claims priority to German Patent Application No. 10 2020 212 173.7, filed Sep. 28, 2020, which is incorporated herein by reference in its entirety.

BACKGROUND

Field

The disclosure relates to a method for acquiring reference data for a phase correction in magnetic resonance technology.

Related Art

Magnetic resonance technology (the abbreviation MR below stands for magnetic resonance) is a known technology with which images of the interior of an object under examination can be generated. Put simply, for this purpose the object under examination is positioned in a magnetic resonance device in a comparatively strong static, homogeneous constant magnetic field, also called a $B_0$ field, with field strengths of between 0.2 tesla and 7 tesla and more, such that its nuclear spins are oriented along the constant magnetic field. To trigger nuclear spin resonances that can be measured as signals, radio-frequency excitation pulses (RF pulses) are beamed into the object under examination, the triggered nuclear spin resonances are measured as what are known as k-space data and on the basis thereof. MR images are reconstructed or spectroscopy data is determined. For position encoding of the measurement data, rapidly switched magnetic gradient fields, called gradients for short, are overlaid on the constant magnetic field. A diagram used, which describes a temporal sequence of RF pulses to be beamed in and gradients to be switched, is known as a pulse sequence (diagram), or also as a sequence for short. The measurement data plotted is digitized and saved as complex numerical values in a k-space matrix. An associated MR image can be reconstructed from the k-space matrix populated with values, e.g. by means of a multidimensional Fourier transform.

Normally a magnetic resonance recording consists of a plurality of individual partial measurements, in which raw data from different slices of the object under examination is recorded, in order then to reconstruct volume image data therefrom.

However, for many examinations it is additionally also necessary to carry out multiple, i.e. a whole series of, magnetic resonance recordings of the object under examination, wherein one particular measurement parameter is varied. On the basis of the measurements the effect of this measurement parameter on the object under examination is observed, in order then subsequently to draw diagnostic conclusions therefrom. A series in this case means at least two, but generally more than two, magnetic resonance recordings. It makes sense in this case for a measurement parameter to be varied such that the contrast of a particular type of material excited during the measurements, for example of one type of tissue of the object under examination or of a chemical substance which is significant for most or particular types of tissue, such as e.g. water, is influenced as strongly as possible by the variation of the measurement parameter. This ensures that the effect of the measurement parameter on the object under examination is particularly readily visible.

A typical example of series of magnetic resonance recordings subject to variation of a measurement parameter strongly influencing the contrast is what are known as "diffusion weighting imaging" (DWI) methods. Diffusion means the Brownian motion of molecules in a medium. In diffusion imaging, multiple images with different diffusion directions and weightings are generally recorded and combined with one another. The strength of the diffusion weighting is mostly defined by what is known as the "b-value". The diffusion images with different diffusion directions and weightings or the images combined therefrom can then be used for diagnostic purposes. Thus using suitable combinations of the recorded diffusion-weighted images, parameter maps with particular diagnostic relevance can be generated, for example maps which show the "Apparent Diffusion Coefficient (ADC)" or the "Fractional Anisotropy (FA)".

In diffusion-weighted imaging, additional gradients reflecting the diffusion direction and diffusion weighting are inserted into a pulse sequence in order to make the diffusion properties of the tissue visible or to measure them. These gradients mean that tissue with a fast diffusion (e.g. cerebrospinal fluid (CSF)) is subject to a stronger signal loss than tissue with a slower diffusion (e.g. the gray matter in the brain). The resultant diffusion contrast is becoming clinically ever more significant and applications now go well beyond the traditional early identification of ischemic stroke.

Diffusion imaging is frequently based on echo planar imaging (EPI) because of the short acquisition time of the EPI sequence per image and its robustness in respect of movement. In an EPI technology, after an excitation and if appropriate one or more refocusing of the excited spins, multiple pairs of gradient echoes are generated by alternating the readout gradient and in this way the k-space is scanned.

Magnetic field inhomogeneities, eddy current effects, slight displacements over time or the like can mean that the different data sets each have a characteristic evolution of the background phase. The background phase pairs for the different data sets can be different. If the data sets are added together without further correction to form an overall data set, the MR image data may exhibit artifacts. Thus for example the alternation of the polarity of the readout gradient in EPI requires that the data read out is inserted into a raw data matrix such that the order in which the data is inserted into the raw data matrix changes from row to row. A slight shift over time during the data acquisition between different gradient echoes can also lead to characteristic phase shifts between the background phase progressions of data read out from even-numbered echoes (for example the second, fourth, etc. echo in a sequence of echo signals) and odd-numbered echoes (for example the first, third, etc. echo in a sequence of echo signals). In position space this manifests itself for example by what are known as ghost artifacts, which are also known as Nyquist ghosts or N/2 ghosts.

To reduce artifacts such as these, a phase correction can be made to the data representing the different segments of the MR recording. To this end a phase correction recording for recording reference data can be performed. The reference data acquired during the phase correction recording can be evaluated and used to determine the phase progression. To determine the reference data, additional bipolar readout gradients can for example be switched without simultaneous phase encoding, as described in U.S. Pat. No. 5,581,184, after the excitation but prior to the start of the EPI readout train. Reference data recorded in this way integrated into the EPI pulse sequence used to record the measurement data can be used for the correction of delays and phase shifts between the measurement data recorded with different polarity in the readout gradients, and for the correction of other parameters that change (including dynamically) because of the integrated recording of the reference data and that influence the recording of the measurement data, such as for example eddy-current-related or temperature-related drifts of the constant magnetic field ("B0 drifts"). However, a disadvantage associated with such a procedure is that by inserting the recording of the reference data into the pulse sequence diagram the minimum echo time achievable with this pulse sequence diagram is extended. In addition, a phase correction based on such reference data for echo signals of off-resonant tissue types (e.g. tissue types with a resonance frequency shifted by a chemical shift), such as e.g. fatty tissue or silicone, may achieve unsatisfactory results, since the effective echo time and the T2* decay of the transverse magnetization are different for the reference data and the measurement data, as a result of which ghost artifacts, e.g. fatty ghost artifacts, may still remain.

Another type of phase correction recording for recording a set of reference data is described for example in U.S. Pat. No. 6,043,651, which uses a separate phase correction recording. For the separate phase correction recording, a pulse sequence is used which in principle corresponds to the pulse sequence used for the acquisition of measurement data performed for the actual imaging, but which does not use any phase encoding. Each segment of the measurement data recorded for imaging can then be modified as a function of the set of reference data acquired with a corresponding phase correction recording, in order to reduce the influences of different phase progressions. A phase correction recording in this case need therefore be performed only once, e.g. prior to the recording of the measurement data.

More precisely, a background phase correction can be performed during the EPI, for example with the method described in U.S. Pat. No. 6,043,651. From a set of reference data, which e.g. is read out from three echoes with alternately positive and negative readout gradients, correction data can be calculated which is used both for the correction of a measurement data set which comprises one echo or multiple echoes that have all been read out in the case of a positive readout gradient, and for the correction of a further measurement data set which comprises one echo or multiple echoes that have all been read out in the case of a negative readout gradient.

By using an identical (except for the phase encoding) pulse sequence for recording both the reference data and the measurement data, the respective effective echo time and the T2* decay, and thus the phase evolution (and phase position), are identical for this type of reference data and measurement data. Similarly the minimum achievable echo time is not extended in this case. However, because a phase correction recording takes place only once, dynamic faults, such as e.g. delays changing in the course of a measurement or B0 drifts, cannot be counterbalanced with such reference data acquired "externally" (outside the pulse sequence for acquiring the measurement data), which in turn can lead to an unsatisfactory phase correction and lingering ghost artifacts.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
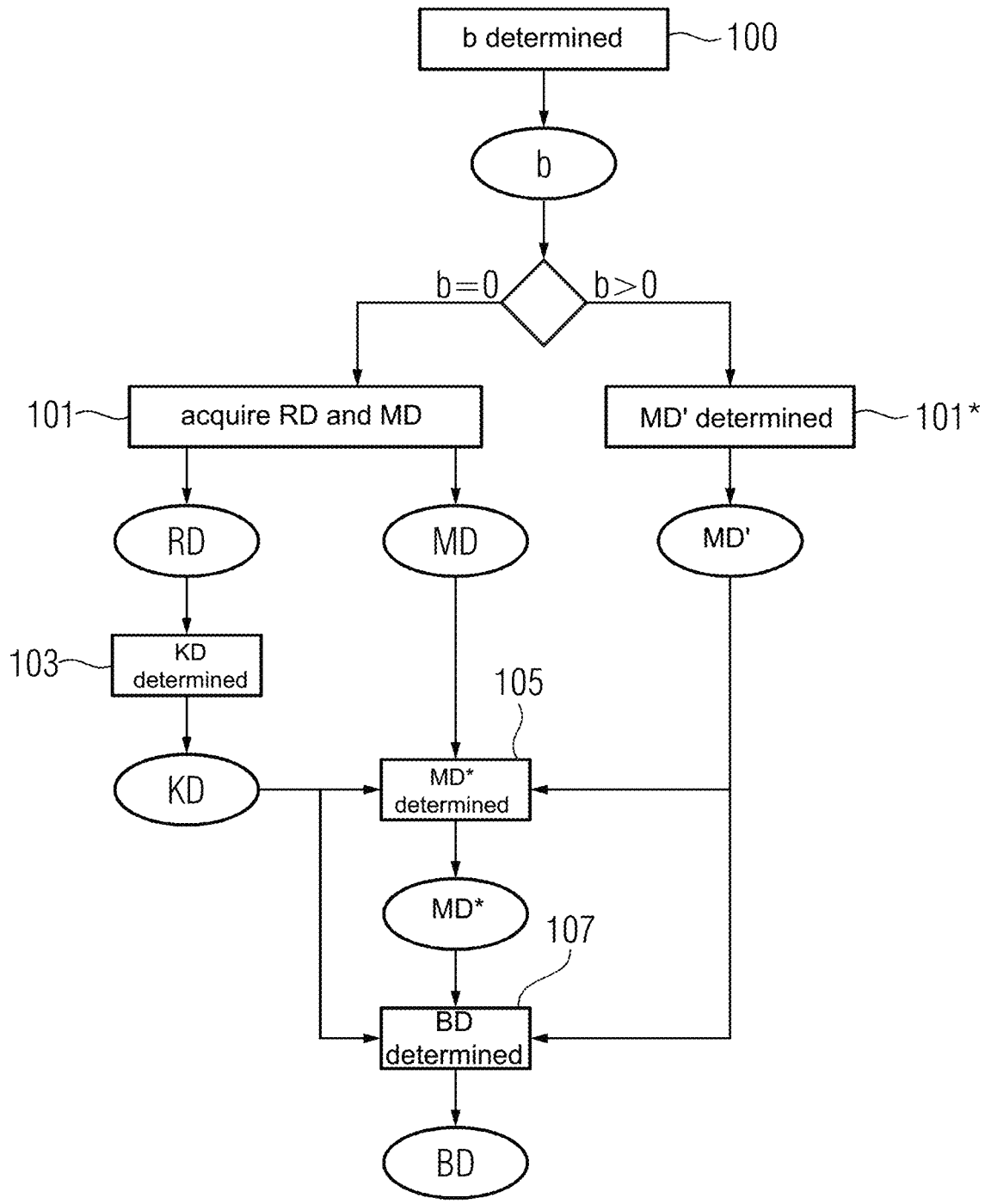
FIG. 1 shows a schematic flow chart of a method for acquiring measurement data of an object under examination and for acquiring reference data for a phase correction of the measurement data, according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to enable an acquisition of reference data for a correction of the phase of measurement data, with which dynamic faults can also be corrected which have a similar phase evolution to the measurement data to be corrected.

This object is achieved by a method for acquiring measurement data of an object under examination and for acquiring reference data for a phase correction of the measurement data by means of a magnetic resonance system, a magnetic resonance system, a computer program, and an electronically readable data storage medium according to the disclosure.

An inventive method for acquiring measurement data of an object under examination and for acquiring reference data for a phase correction of the measurement data by means of a magnetic resonance system comprises the steps:

beaming of an RF excitation pulse for exciting spins in the object under examination, beaming of at least one RF refocusing pulse for refocusing the spins excited by the RF excitation pulse, acquisition of measurement data by recording echo signals of refocused spins excited by the RF excitation pulse by switching readout gradients that alternate in their polarity, chronologically between the beaming of the RF excitation pulse and the acquisition of the measurement data, acquisition of reference data by recording at least two echo signals while switching readout gradients with different polarity, based on the acquired reference data, determination of correction data for phase correction of phase errors contained in the measurement data.

Thanks to an inventive acquisition of the reference data between RF excitation pulse and acquisition of the measurement data the reference data maps faults in an up-to-date manner, as a result of which dynamic faults can be corrected using correction data determined on the basis of the acquired reference data.

If the readout gradients switched for an acquisition of reference data are arranged symmetrically around a switched RF refocusing pulse, it is possible, by averaging the reference data acquired prior to and after the RF refocusing pulse, for reference data averaged in this way to correspond to reference data which exhibits a phase evolution as if it had been acquired in the isodelay center of the RF refocusing pulse. A phase evolution of reference data averaged in this way can thus correspond to a phase evolution of acquired measurement data.

The method can advantageously be used in the context of diffusion measurements, in which diffusion measurement data with different diffusion encodings is acquired. The measurement data to be inventively acquired can here be measurement data to be acquired in the context of a diffusion measurement with a diffusion encoding with a b-value equal to zero, i.e. the reference data is acquired with a pulse sequence with which diffusion measurement data for b=0 is also acquired as measurement data to be inventively acquired. In pulse sequences that are used for diffusion measurements, there is generally enough time between an excitation and an acquisition of the diffusion measurement data to perform a recording of echo signals for acquiring reference data. Thus the acquisition of the reference data does not influence the minimum echo time achievable for the acquisition of the diffusion measurement data. The reference data can here be acquired in a diffusion separation phase of the diffusion measurement arranged after the RF excitation pulse and prior to the acquisition of the measurement data.

An inventive magnetic resonance system comprises a magnet unit, a gradient unit, a radio-frequency unit and a controller with a reference data unit designed to perform an inventive method.

An inventive computer program implements an inventive method on a controller when it is executed on the controller.

The computer program can here also be present in the form of a computer program product that can be loaded directly into a memory of a controller, with program encoding means to execute an inventive method when the computer program product is executed in the processor of the computing system.

An inventive electronically readable data storage medium comprises electronically readable control information stored thereon, which comprises at least one inventive computer program and is configured such that it performs an inventive method when the data storage medium is used in a controller of a magnetic resonance system.

The advantages and explanations specified in respect of the method also apply analogously for the magnetic resonance system, the computer program product and the electronically readable data storage medium.

FIG. 1 is a schematic flow chart of an inventive method for acquiring measurement data of an object under examination and for acquiring reference data for a phase correction of the measurement data by means of a magnetic resonance system.

In this case an RF excitation pulse for exciting spins in the object under examination followed by at least one RF refocusing pulse for refocusing the spins excited by the RF excitation pulse is beamed in and measurement data MD of spins excited by the RF excitation pulse and refocused by recording echo signals is acquired by switching readout gradients alternating in their polarity and, chronologically between the beaming in of the RF excitation pulse and the acquisition of the measurement data MD, reference data RD is acquired by recording at least two echo signals while switching readout gradients with different polarity (Block 101). Examples of possible pulse sequence diagrams for acquiring the reference data RD and measurement data MD are described below with reference to FIGS. 2 to 5.

Correction data KD for the phase correction of phase errors contained in the measurement data MD is determined on the basis of the acquired reference data RD (Block 103).

A correction of the phase errors contained in the measurement data MD can be performed on the basis of the correction data KD, as a result of which corrected measurement data MD' is determined (Block 105). In this case for example a correction method for phase correction described above, e.g. according to U.S. Pat. No. 5,581,184 or 6,043,651, is used. On the basis of the corrected measurement data MD', image data BD can be reconstructed which contains no artifacts, or only a few artifacts, caused by phase errors (Block 107).

The correction data KD can also be used in a reconstruction of image data BD carried out on the basis of the measurement data MD, in order retrospectively to correct artifacts caused by phase errors.

On the basis of the correction data KD, ghost artifacts and artifacts due to B0 drifts can in particular be corrected.

Figure 2:
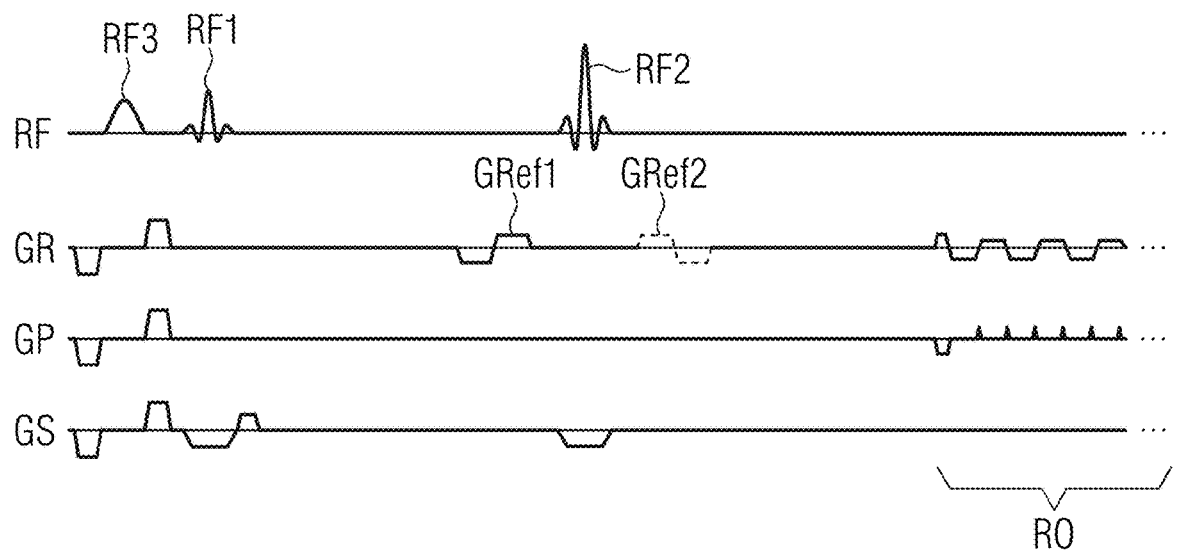
FIG. 2 shows an example of a schematically shown part of a pulse sequence diagram for acquiring measurement data and inventive reference data according to an exemplary embodiment.

FIG. 2 shows an example of a schematically shown part of a pulse sequence diagram for acquiring measurement data and inventive reference data.

The RF pulses to be beamed in are shown in the top row RF, the gradients to be switched respectively in the readout direction GR, phase encoding direction GP and slice encoding direction GS are shown in the three rows below this.

After an RF excitation pulse RF1, an RF refocusing pulse RF2 is beamed in, which refocuses spins excited by the RF excitation pulse RF1 and thus generates echo signals (not shown) which are recorded in the normal way in a readout phase RO with readout gradients switched alternating in their polarity in the readout direction and recorded in corresponding phase encoding gradients switched in the phase encoding direction and are acquired as measurement data. In each case simultaneously with the RF excitation pulse RF1 and/or the RF refocusing pulse RF2 it is possible to switch slice selection gradients in the slice selection direction to limit the effect of the RF pulses RF1 and/or RF2 to one slice. If desired a further RF pulse, an RF preparation pulse RF3, can be beamed in before beaming in the RF excitation pulse RF1, said RF preparation pulse RF3 e.g. already effectuating a preparation of the spins in the object under examination, e.g. a fat saturation. Spoiler gradients can if necessary be switched, e.g. as shown prior to and after an RF preparation pulse RF3 in all directions GR, GP and GS, and after the RF excitation pulse RF1.

In order to acquire reference data, at least one readout gradient GRef1 is switched in the readout direction and in the example shown in FIG. 2 is bipolar and thus records an echo signal with positive polarity of the readout gradient GRef1 and an echo signal with negative polarity of the readout gradient GRef1 in order to acquire reference data.

It is also conceivable that additionally or alternatively for acquiring reference data at least one readout gradient GRef2 is switched in the readout direction. In the example shown in FIG. 2 the readout gradient GRef2 is also bipolar and thus also records an echo signal with positive polarity of the readout gradient GRef2 and an echo signal with negative polarity of the readout gradient GRef2 in order to acquire reference data.

The reference data can be acquired immediately prior to and/or immediately after the switched RF refocusing pulse RF2. In this way it is possible to make optimum use of a time period available for an acquisition of reference data.

For an acquisition of reference data in accordance with the example shown in FIG. 2 the reference data can in each case be acquired as described in U.S. Pat. No. 5,581,184 already referred to above. If reference data is acquired both prior to and after the RF refocusing pulse RF2 it can be averaged. Because of the bipolarity of the readout gradients GRef1 and GRef2, the respective zeroth moment of the readout gradient GRef1 and of the readout gradient GRef2 disappears, without further measures having had to be taken.

If the readout gradients GRef1 and GRef2 switched for an acquisition of reference data are arranged symmetrically around a switched RF refocusing pulse RF2, the reference data acquired in this way can be averaged, such that the averaged reference data in the isodelay center of the RF refocusing pulse RF2 corresponds to acquired reference data.

Figure 3:
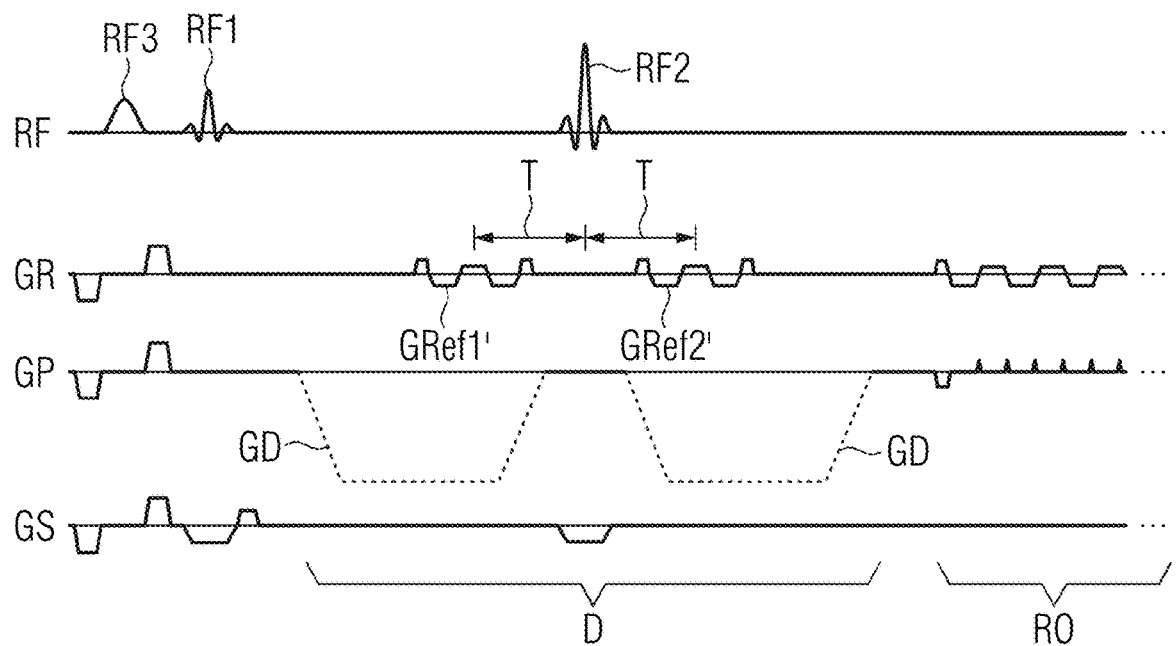
FIG. 3 shows a further example of a schematically shown part of a pulse sequence diagram for acquiring measurement data and inventive reference data, according to an exemplary embodiment.

FIG. 3 shows a further example of a schematically shown part of a pulse sequence diagram for acquiring measurement data and inventive reference data.

The RF pulses to be beamed in are again shown in the top row RF, the gradients to be switched respectively in the readout direction GR, phase encoding direction GP and slice encoding direction GS are shown in the three rows below this.

After an RF excitation pulse RF1 an RF refocusing pulse RF2 is beamed in, which refocuses spins excited by the RF excitation pulse RF1 and thus generates echo signals (not shown) which are recorded in the normal way in a readout phase RO with readout gradients switched alternating in their polarity in the readout direction and recorded in corresponding phase encoding gradients switched in the phase encoding direction and are acquired as measurement data. The example shown here corresponds in particular to a once-refocused Stejskal-Tanner diagram but a multiply refocused diagram with more than one RF refocusing pulse RF2, e.g. in the case of a twice-refocused diagram with two RF refocusing pulses, is also conceivable, wherein the explanations given below apply to at least one of the multiple RF refocusing pulses up to all the multiple RF refocusing pulses.

In each case simultaneously with the RF excitation pulse RF1 and/or the RF refocusing pulse RF2 it is possible to switch slice selection gradients in the slice selection direction to limit the effect of the RF pulses RF1 and/or RF2 to one slice. If desired a further RF pulse, an RF preparation pulse RF3, can be beamed in before beaming in the RF excitation pulse RF1, said RF preparation pulse RF3 e.g. already effecting a preparation of the spins in the object under examination, e.g. a fat saturation. Spoiler gradients can if necessary be switched, e.g. as shown prior to and after an RF preparation pulse RF3 in all directions GR, GP and GS, and after the RF excitation pulse RF1.

In order to acquire reference data, at least one readout gradient GRef1' is switched in the readout direction and in the example shown in FIG. 3 records two echo signals with negative polarity of the readout gradient GRef1' and one echo signal with positive polarity of the readout gradient GRef1', in order to acquire reference data. Thus an acquisition of reference data by means of a readout gradient GRef1' comprises a recording of at least three echo signals prior to the RF refocusing pulse RF2.

It is also conceivable that additionally or alternatively for acquiring reference data at least one readout gradient GRef2' is switched in the readout direction. In the example shown in FIG. 3 the readout gradient GRef2' also records an echo signal with positive polarity of the readout gradient GRef2' and two echo signals with negative polarity of the readout gradient GRef2' in order to acquire reference data. Here too, an acquisition of reference data by means of a readout gradient GRef2' comprises a recording of at least three echo signals, but after the RF refocusing pulse RF2.

The reference data can again be acquired immediately prior to and/or immediately after the switched RF refocusing pulse RF2. In this way it is possible to make optimum use of a time period available for an acquisition of reference data.

If reference data is acquired both prior to and after the RF refocusing pulse RF2, it can be averaged.

For an acquisition of reference data in accordance with the example shown in FIG. 3 the reference data can in each case be acquired as described in U.S. Pat. No. 6,043,651 already referred to above. In particular, two reference signals can be determined from the three echo signals recorded with a readout gradient GRef1' or GRef2', as described in U.S. Pat. No. 6,043,651, and are assigned to different polarities but have an identical effective echo time, as a result of which a phase correction based on reference signals determined from the reference data can be improved.

The readout gradients GRef1' and GRef2' switched for an acquisition of reference data can be arranged symmetrically around a switched RF refocusing pulse RF2. In other words, the RF refocusing pulse RF2 lies centrally between the readout gradients GRef1' and GRef2', such that a time T which elapses after a center of the readout gradient GRef1' until the center of the RF refocusing pulse RF2 is reached is identical to the time T which elapses after the center of the RF refocusing pulse RF2 until the center of the readout gradient GRef2' is reached.

If the readout gradients GRef1' and GRef2' switched for an acquisition of reference data are arranged symmetrically around a switched RF refocusing pulse RF2, the reference data acquired in this way can be averaged, such that the averaged reference data in the isodelay center of the RF refocusing pulse RF2 corresponds to acquired reference data. Thus reference data averaged in this way and acquired measurement data have a matching phase evolution, and artifacts due to off-resonant spins can be prevented. Furthermore, thanks to a phase inversion caused by the RF refocusing pulse RF2, the zeroth moment accumulated overall by the readout gradient GRef1' and the readout gradient GRef2' disappears for readout gradients GRef1' and GRef2' arranged symmetrically around a switched RF refocusing pulse RF2, without further measures having had to be taken.

Also in the context of a diffusion measurement, reference data can be acquired between beaming in of an RF excitation pulse and an acquisition of measurement data by reading out echo signals excited by the RF excitation pulse. A diffusion measurement comprises multiple measurements for acquiring measurement data with a different diffusion encoding in each case, also including with a diffusion encoding with a b-value equal to zero (b=0). If reference data is acquired in the context of a diffusion measurement, the measurement data to be acquired is measurement data to be acquired in the context of a diffusion measurement with a diffusion encoding with a b-value b=0. In other words, the reference data is acquired in measurements of the diffusion measurement in which no diffusion gradients GD are switched. Although in FIG. 3 diffusion gradients GD are shown as a dashed line, these are however intended merely to give an example of where diffusion gradients GD may be positioned in a diffusion-encoded measurement with a b-value b>0 in a diffusion separation phase D.

The reference data can be acquired in a diffusion separation phase D which is arranged after the RF excitation pulse and prior to the acquisition of the measurement data and in which no diffusion gradients GD are switched (since b=0). A diffusion separation phase D provides sufficient space (over time) for acquiring reference data, such that an achievable minimum echo time for the measurement data to be acquired is not influenced.

In FIG. 1, a possible acquisition of reference data in the context of a diffusion measurement is sketched by the optional blocks 100 and 101*. In this case the diffusion encodings b desired for the diffusion measurement are determined (Block 100). As a function of the diffusion encoding b desired for a measurement of the diffusion measurement, either reference data RD and measurement data MD according to Block 101 are acquired (query b=0), or measurement data MD' diffusion-weighted only according to the desired diffusion encoding b is acquired without an acquisition of reference data (Block 101*).

In this case diffusion-weighted measurement data MD* acquired in the context of the diffusion measurement with a diffusion encoding with a b-value not equal to zero can also be corrected with the determined correction data KD (Blocks 105 and/or 107). A correction of diffusion-weighted measurement data MD* can take place analogously to a correction of acquired measurement data MD already described above.

To be able to acquire reference data and thus determine correction data during a first measurement in the context of a diffusion measurement, it is advantageous if measurement data to be acquired first in the context of the diffusion measurement is measurement data with a diffusion encoding with a b-value equal to zero. In this way reference data can already be acquired and correction data determined in the first measurement to be performed in the context of the diffusion measurement.

If measurement data that has a diffusion encoding with a b-value equal to zero and that is to be acquired more than once, in particular regularly, in the context of the diffusion measurement is acquired together with reference data, correction data can also be determined more than once (regularly), as a result of which changing (dynamic) faults can also continue to be corrected.

What are known as simultaneous multi-slice imaging techniques (SMS techniques), in which a tuple of slices are recorded at the same time, have also been increasingly used in clinical applications, since the overall measurement time can be significantly reduced by the simultaneous recording of measurement data from different slices.

Examples of known SMS methods include what is known as Hadamard encoding, methods using simultaneous echo refocusing, methods using broadband data recording and methods that employ parallel imaging in the slice direction. Examples of the latter methods also include the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, p. 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, p. 1210-1224.

A correction of ghost artifacts has hitherto been performed in conjunction with SMS techniques primarily with static correction data determined in separate measurements, since reference data acquired in a non-phase-encoded manner for multiple slices cannot be split into reference data for the individual slices using the usual methods, e.g. the "slice GRAPPA" used in CAIPRINHA.

However, in U.S. Ser. No. 10/162,037 a method is described in which reference data acquired in a collapsed manner for multiple slices (in what is known as a "navigator sequence") by switching gradient blips in the phase encoding direction during the acquisition of the reference data can also be separated into reference data for the individual slices. As described in U.S. Ser. No. 10/162,037, reference data must be acquired multiple times with a different polarized readout gradient in each case for a correction of ghost artifacts. If in addition reference data is acquired without switched phase encoding gradients, corrections can also be made using B0 drifts. However, in the method described in U.S. Ser. No. 10/162,037 a minimum achievable echo time is extended during the acquisition of measurement data to be corrected, since the gradients switched during the acquisition of the reference data have to be prepared and if appropriate reversed such that overall an accumulated zeroth moment disappears in each gradient axis, and since depending on the size of a calibration kernel used for SMS technology for the separation of signals recorded in a collapsed manner into signals of the individual slices more than three echo signals have to be recorded for the acquisition of the reference data, e.g. a number of echo signals recorded for an acquisition of reference data can be selected such that said number corresponds to the size of a calibration kernel to be used.

Figure 4:
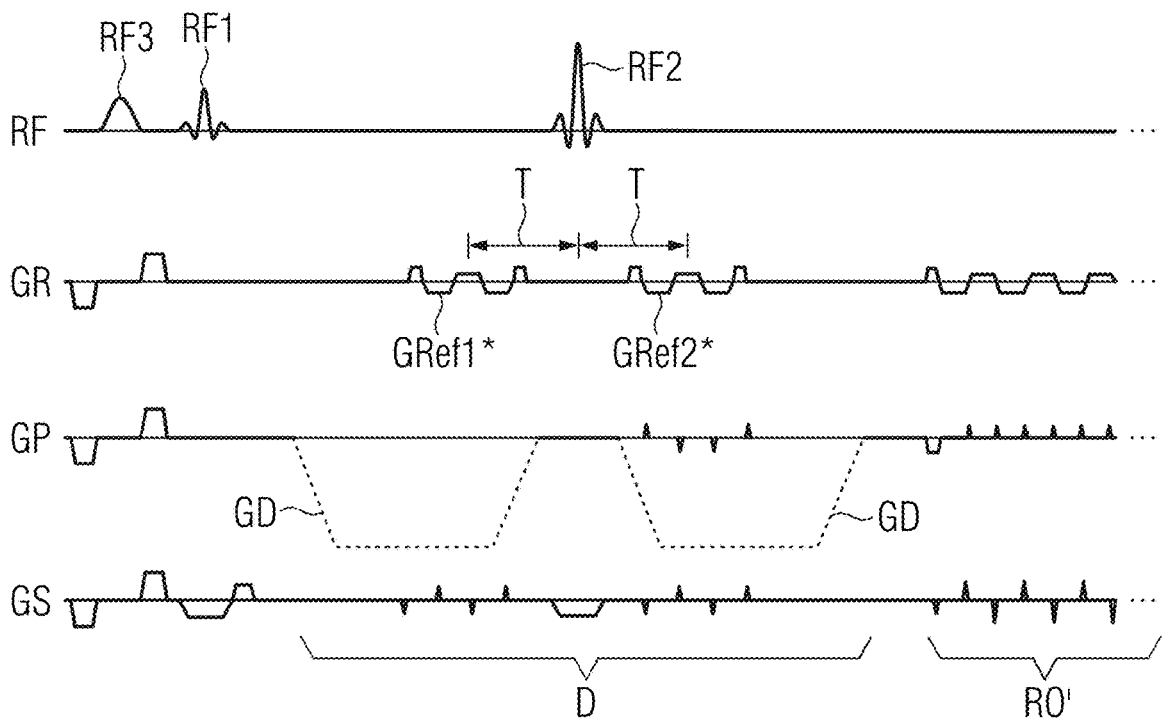
FIG. 4 shows yet another example of a schematically shown part of a pulse sequence diagram for acquiring measurement data and inventive reference data, according to an exemplary embodiment.

FIG. 4 shows an example of a schematically shown part of a pulse sequence diagram for acquiring measurement data and inventive reference data, in which the measurement data and the reference data are for example acquired using a CAIPIRINHA method and which continues the technique described in U.S. Ser. No. 10/162,037.

The explanations given above in respect of FIG. 3 apply analogously for FIG. 4. However, unlike the example in FIG. 3 the RF excitation pulse RF1 and the RF refocusing pulse RF2 act on multiple slices of the object under examination, such that measurement data and reference data are acquired in a collapsed manner for these multiple slices. To be able to separate the measurement data acquired in a collapsed manner into measurement data of the individual slices, additional gradient blips are switched in the readout phase RO in the slice selection direction, as is customary in CAIPIRINHA techniques.

By switching the readout gradients GRef1* and GRef2* shown in FIG. 4, reference data for the multiple slices is acquired in a collapsed manner. Otherwise the explanations given in respect of FIG. 3 for the readout gradients GRef1' and GRef2' apply analogously here too. In addition to the readout gradients GRef1* and GRef2*, in the example in FIG. 4 gradient blips are also switched in the slice selection direction (for a separation of the reference data acquired in a collapsed manner into reference data of the individual slices) during the acquisition of the reference data.

An acquisition of the measurement data and the reference data can thus take place by means of a simultaneous multi-slice (SMS) technique, such that measurement data and reference data is acquired simultaneously for at least two slices, and during the acquisition of the reference data gradient blips are switched in the phase encoding direction and in the slice encoding direction, said gradient blips permitting a separation of the reference data for the individual slices which was acquired simultaneously for multiple slices.

Furthermore, gradient blips are switched in the phase encoding direction during the acquisition of the reference data. The gradient blips in the phase encoding direction are here in particular switched in accordance with the method described in U.S. Ser. No. 10/162,037.

The pulse sequence diagram shown in FIG. 4 can be repeated once again, wherein the readout gradients of the repetition correspond to readout gradients GRef1* and GRef2* mirrored on the readout gradient axis. In this way the readout gradients (not shown) switched during a repeated acquisition of reference data are reversed in their polarity compared to the readout gradients switched during a previous acquisition of reference data. With the acquired reference data and the reference data acquired during a repetition of this type, a ghost correction method as described in U.S. Ser. No. 10/162,037 can be performed. Furthermore, a further repetition of the pulse sequence diagram shown in FIG. 4 can be performed, in which during the acquisition of the reference data no gradients are switched in the phase encoding direction. Thus a correction of B0 drifts as described in U.S. Ser. No. 10/162,037 can also be performed.

If the reference data, as already described in respect of FIG. 3, is acquired in a diffusion separation phase D in the context of a diffusion measurement where b=0, a minimum achievable echo time need not be extended during the acquisition of the measurement data.

Figure 5:
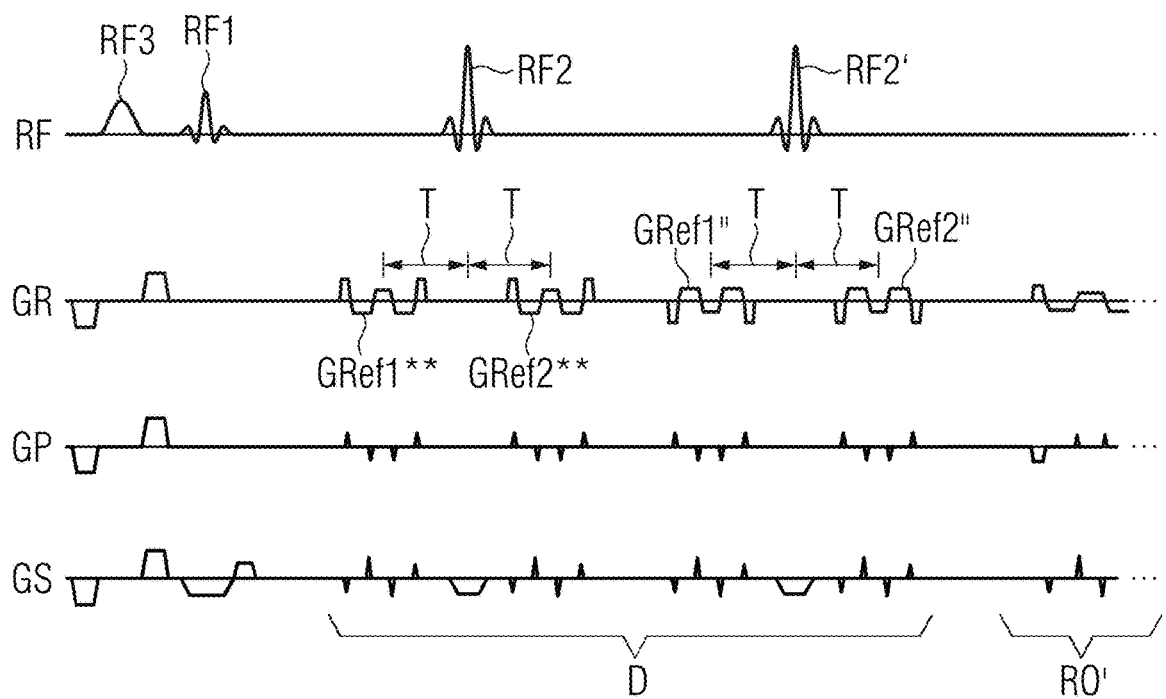
FIG. 5 shows yet another example of a schematically shown part of a pulse sequence diagram for acquiring measurement data and inventive reference data, according to an exemplary embodiment.

FIG. 5 shows a further example of a schematically shown part of a pulse sequence diagram for acquiring measurement data and inventive reference data, in which the measurement data and the reference data are acquired for example using a CAIPIRINHA method and which continues the technique described in U.S. Ser. No. 10/162,037.

The explanations given above in respect of FIG. 4 substantially apply analogously for FIG. 4. Unlike the example in FIG. 4, FIG. 5 shows a twice-refocused pulse sequence diagram with two RF refocusing pulses RF2.

The explanations given in respect of FIG. 4 apply analogously to the readout gradients GRef1* and GRef2* referred to there for the readout gradients GRef1 and GRef2 switched prior to and after the RF refocusing pulse RF2 for acquiring reference data beamed in first after the RF excitation pulse RF1. Since yet another RF refocusing pulse RF2' is beamed in after the first RF refocusing pulse RF2, reference data can also be acquired by switching readout gradients GRef1" and GRef2" and by switching gradient blips in the phase encoding direction GP and the slice encoding direction GS. The polarity of the readout gradients GRef1" and GRef2" can advantageously be reversed compared to the readout gradients GRef1 and GRef2, such that the reference data acquired by switching the readout gradients GRef1", GRef2" and GRef1, GRef2 can already be used to perform a correction of ghost artifacts in accordance with a method described in U.S. Ser. No. 10/162, 037. In addition, a correction of B0 drifts can already be performed with the reference data acquired by switching the readout gradients GRef1", GRef2" and GRef1, GRef2, without further reference data having had to be acquired, since a B0 drift correction can already be performed directly on the basis of reference data which in each case was acquired in the central k-space at a center of two of the readout gradients GRef1", GRef2" and GRef1, GRef2, e.g. in each case at a center of the readout gradients GRef2" and GRef1**.

The method described for acquiring reference data according to an exemplary embodiment permits a dynamic phase correction, wherein an identical phase evolution can be achieved in the case of acquired reference data and acquired measurement data. Using correction data determined on the basis of the acquired reference data, both ghost artifacts and B0 drifts and other dynamic faults can be corrected. Neither a minimum achievable echo time during the acquisition of the measurement data nor an overall measurement time need be extended for the acquisition of the inventive reference data.

Figure 6:
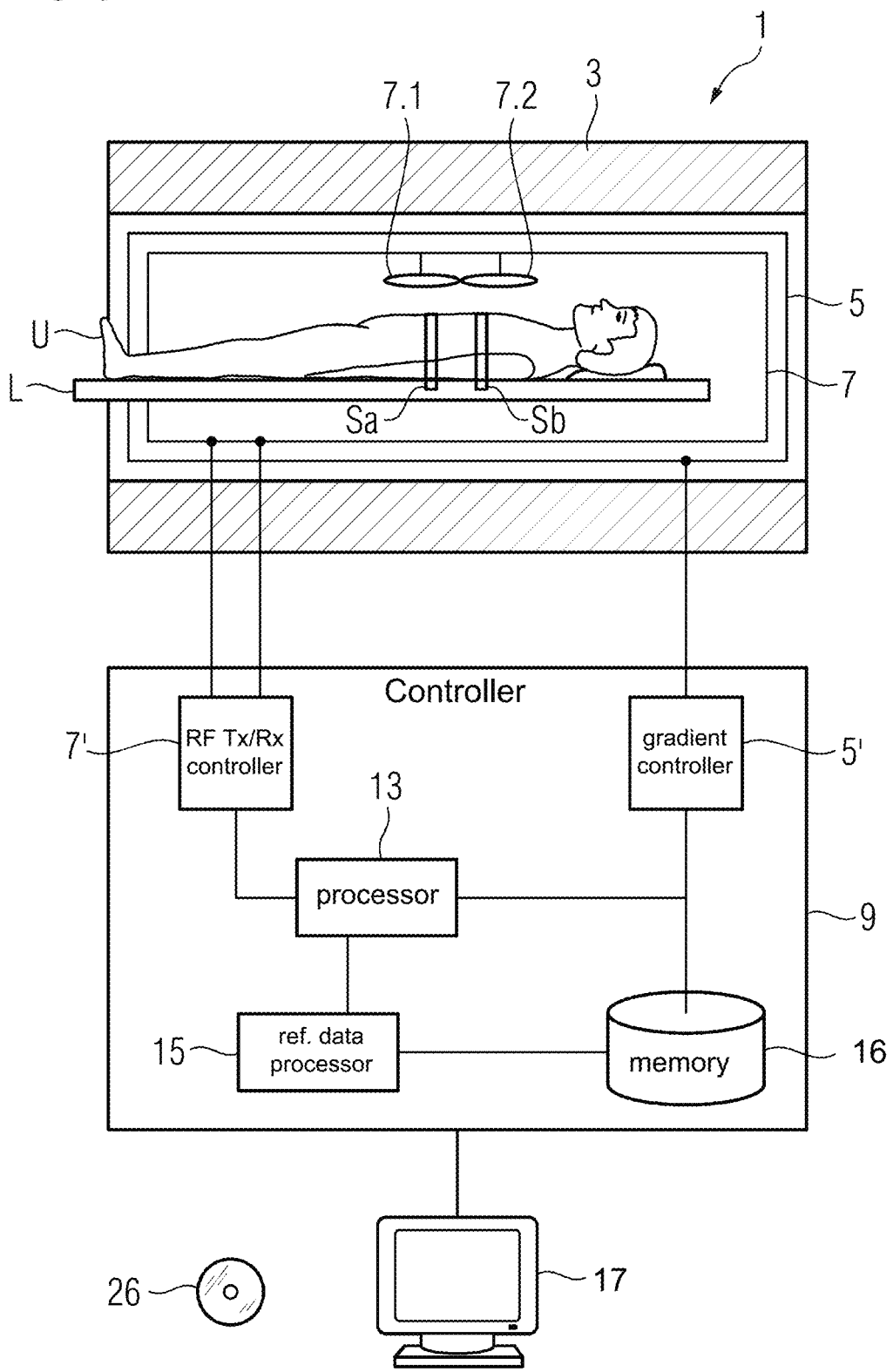
FIG. 6 shows a magnetic resonance system according to an exemplary embodiment.

FIG. 6 schematically shows an inventive magnetic resonance (MR) system 1. This comprises a magnet unit 3 for generating the constant magnetic field, a gradient unit 5 for generating the gradient fields, a radio-frequency unit 7 for beaming and receiving radio-frequency signals and a controller 9 designed for the performance of an inventive method. The magnet unit 3, a gradient unit 5, and a radio-frequency unit 7 may collectively form a MR scanner.

In FIG. 6 these subunits of the magnetic resonance system 1 are only roughly schematically shown. In particular, the radio-frequency (RF) unit 7 can consist of multiple subsidiary units, for example of multiple coils such as the schematically shown coils 7.1 and 7.2 or more coils, that can be configured either only to transmit radio-frequency signals or only to receive the triggered radio-frequency signals or for both.

To examine an object under examination U, for example a patient or else a phantom, it can be introduced into the measurement volume of the magnetic resonance system 1 on a patient couch L. The slices or the slabs Sa and Sb represent exemplary target volumes of the object under examination, from which, if appropriate simultaneously, echo signals are to be recorded and acquired as measurement data.

The controller 9 serves to control the magnetic resonance system 1 and can in particular control the gradient unit 5 by means of a gradient controller 5' and the radio-frequency unit 7 by means of a radio-frequency transmit/receive controller 7'. The radio-frequency unit 7 can here comprise multiple channels on which signals can be transmitted or received.

The radio-frequency unit 7 is responsible, together with its radio-frequency transmit/receive controller 7', for generating and beaming (transmitting) a radio-frequency alternating field for manipulation of the spins in a region to be manipulated (for example in slices S to be measured) of the object under examination U. In this case the center frequency of the radio-frequency alternating field, also called the B1 field, is generally where possible set such that it lies close to the resonance frequency of the spins to be manipulated. Deviations of the resonance frequency from the center frequency are called off-resonance. To generate the B1 field, currents controlled by means of the radio-frequency transmit/receive controller 7' are applied to the RF coils in the radio-frequency unit 7.

The controller 9 further comprises a reference data processor 15, with which readout gradients for the acquisition of inventive reference data can be determined, which can be implemented by the gradient controller 5', and the reference data can be acquired. The controller 9 is designed overall to perform an inventive method. In an exemplary embodiment, the controller 9 (and/or one or more of its components) includes processing circuitry that is configured to perform one or more functions of the controller 9 (and/or respective components therein).

A processor 13 comprised within the controller 9 is configured to execute all computing operations needed for the necessary measurements and determinations. Interim results and results required for this or determined hereby can be stored in a memory 16 of the controller 9 and/or one or more external memory units. The units shown are here not necessarily to be understood as physically separate units, but merely represent a classification into meaningful/functional units, which however can also be implemented e.g. in fewer or even in just one single physical unit.

Control commands to the magnetic resonance system can be routed and/or results of the controller 9 such as e.g. image data can be displayed via an input/output device 17 of the magnetic resonance system 1, e.g. by a user.

A method described herein can also be present in the form of a computer program product which comprises a program and the described method can be implemented on a controller 9 when it is executed on the controller 9. Likewise, an electronically readable data storage medium 26 with electronically readable control information stored thereon can be present, said information at least comprising a computer program product of the type just described and being configured such that it performs the described method when the data storage medium 26 is used in a controller 9 of a magnetic resonance system 1.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for acquiring measurement data of an object under examination and for acquiring reference data for a phase correction of the measurement data using a magnetic resonance (MR) system, the method comprising:
    providing, by a MR scanner of the MR system, a radio frequency (RF) excitation pulse to excite spins in the object under examination;
    providing, by the MR scanner, one or more RF refocusing pulses to refocus the spins excited by the RF excitation pulse;
    acquiring, by a controller of the MR system, measurement data by recording echo signals of refocused spins excited by the RF excitation pulse by switching readout gradients that alternate in their polarity;
    chronologically between the providing of the RF excitation pulse and the acquisition of the measurement data, recording, by the controller, at least two echo signals while switching readout gradients with different polarity to acquire reference data;
    based on the acquired reference data, determining, by the controller, correction data for phase correction of phase errors contained in the measurement data; and
    by the controller, generating an electronic signal representing the correction data and providing the electronic signal as an output of the controller.

2. A non-transitory computer-readable storage medium with an executable program stored thereon, that when executed, instructs a processor to perform a method for acquiring measurement data of an object under examination and for acquiring reference data for a phase correction of the measurement data, the method comprising:
    providing a radio frequency (RF) excitation pulse to excite spins in object under examination;
    providing one or more RF refocusing pulses to refocus the spins excited by the RF excitation pulse;
    acquiring measurement data by recording echo signals of refocused spins excited by the RF excitation pulse by switching readout gradients that alternate in their polarity;
    chronologically between the providing of the RF excitation pulse and the acquisition of the measurement data, recording at least two echo signals while switching readout gradients with different polarity to acquire reference data;
    based on the acquired reference data, determining the correction data for phase correction of phase errors contained in the measurement data; and
    generating an electronic signal representing the correction data and providing the electronic signal as an output of the controller.

3. A magnetic resonance (MR) system adapted to acquire measurement data of an object under examination and to acquire reference data for a phase correction of the measurement data, the MR system, comprising:
    a MR scanner; and
    a controller configured to:
        control the MR scanner to provide a radio frequency (RF) excitation pulse to excite spins in the object under examination;
        control the MR scanner to provide one or more RF refocusing pulses to refocus the spins excited by the RF excitation pulse;
        acquire measurement data by recording echo signals of refocused spins excited by the RF excitation pulse by switching readout gradients that alternate in their polarity;
        chronologically between the providing of the RF excitation pulse and the acquisition of the measurement data, record at least two echo signals while switching readout gradients with different polarity to acquire reference data;
        based on the acquired reference data, determine correction data for phase correction of phase errors contained in the measurement data; and
        generate an electronic signal representing the correction data and provide the electronic signal as an output of the controller.

4. The method as claimed in claim 1, wherein the reference data is acquired immediately prior to and/or immediately after the one or more RF refocusing pulses switched between the RF excitation pulse and the acquisition of the measurement data.

5. The method as claimed in claim 1, wherein the readout gradients switched for an acquisition of reference data are arranged symmetrically around a switched RF refocusing pulse.

6. The method as claimed in claim 1, wherein the acquiring of the reference data comprises recording at least three echo signals prior to and/or after a switched RF refocusing pulse.

7. The method as claimed in claim 6, wherein two reference signals are determined from the at least three recorded echo signals, the two reference signals being assigned to different polarities but having an identical effective echo time.

8. The method as claimed in claim 1, wherein a zeroth moment, accumulated by readout gradients switched for the acquisition of reference data up to a start of an acquisition of measurement data, disappears.

9. The method as claimed in claim 1, wherein the measurement data to be acquired is based on a diffusion measurement with a diffusion encoding with a b-value equal to zero.

10. The method as claimed in claim 9, wherein the reference data is acquired in a diffusion separation phase arranged after the RF excitation pulse and prior to the acquisition of the measurement data.

11. The method as claimed in claim 9, further comprising correcting diffusion-weighted measurement data with the determined correction data, the diffusion-weighted measurement data being acquired by the diffusion measurement with a diffusion encoding with a b-value not equal to zero.

12. The method as claimed in claim 9, wherein measurement data to be acquired based on the diffusion measurement is measurement data with a diffusion encoding with a b-value equal to zero.

13. The method as claimed in claim 9, wherein the measurement data that has a diffusion encoding with a b-value equal to zero and that is to be acquired more than once in the diffusion measurement is acquired together with the reference data.

14. The method as claimed in claim 1, wherein the measurement data and the reference data is acquired using a simultaneous multi-slice (SMS) technique, such that the measurement data and the reference data are acquired for at least two slices simultaneously, and during the acquisition of the reference data, gradient blips are switched in a phase encoding direction and in a slice encoding direction, the gradient blips permitting a separation of the reference data for the individual slices which was acquired simultaneously for multiple slices.

15. The method as claimed in claim 1, further comprising displaying the correction data on a display screen.

16. The method as claimed in claim 1, further comprising storing the correction data in a memory.

17. The method as claimed in claim 1, wherein recording the at least two echo signals chronologically between the providing of the RF excitation pulse and the acquisition of the measurement data includes recording the at least two echo signals after the RF excitation pulse is provided and before the acquisition of the measurement data.

18. The method as claimed in claim 1, wherein the reference data corresponds to the recorded at least two echo signals.

\* \* \* \* \*